US012657369B2

(12) United States Patent
Yu et al.

(10) Patent No.: US 12,657,369 B2
(45) Date of Patent: Jun. 16, 2026

(54) BI-DIRECTIONAL DYNAMIC FUNCTION EXCHANGE

(71) Applicant: Xilinx, Inc., San Jose, CA (US)

(72) Inventors: Hao Yu, Broomfield, CO (US);
Raymond Kong, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 728 days.

(21) Appl. No.: 18/066,852

(22) Filed: Dec. 15, 2022

(65) Prior Publication Data

US 2024/0202421 A1     Jun. 20, 2024

(51) Int. Cl.
G06F 30/394     (2020.01)
G06F 30/398     (2020.01)

(52) U.S. Cl.
CPC .......... G06F 30/394 (2020.01); G06F 30/398 (2020.01)

(58) Field of Classification Search
CPC ...... G06F 30/39; G06F 30/343; G06F 30/347; G06F 30/394; G06F 30/398; G06F 30/34; G06F 30/392; H10D 89/10
USPC ........................................................ 716/126
See application file for complete search history.

(56) References Cited

U.S. PATENT DOCUMENTS

| | | | |
|---|---|---|---|
| 6,091,263 A | 7/2000 | New et al. | |
| 6,150,839 A | 11/2000 | New | |
| 6,204,687 B1 | 3/2001 | Schultz et al. | |
| 6,462,579 B1 | 10/2002 | Camilleri et al. | |

| | | | |
|---|---|---|---|
| 6,507,211 B1 | 1/2003 | Schultz et al. | |
| 6,525,562 B1 | 2/2003 | Schultz et al. | |
| 6,526,557 B1 | 2/2003 | Young et al. | |
| 6,573,748 B1 | 6/2003 | Trimberger | |
| 6,625,794 B1 | 9/2003 | Trimberger | |
| 6,759,869 B1 | 7/2004 | Young et al. | |
| 6,810,514 B1 | 10/2004 | Alfke et al. | |
| 6,836,842 B1 | 12/2004 | Guccione et al. | |
| 6,907,595 B2 | 6/2005 | Curd et al. | |
| 7,024,651 B1 | 4/2006 | Camilleri et al. | |
| 7,057,413 B1 | 6/2006 | Young et al. | |
| 7,109,750 B2 | 9/2006 | Vadi et al. | |
| 7,124,338 B1 | 10/2006 | Mark et al. | |
| 7,138,820 B2 | 11/2006 | Goetting et al. | |
| 7,218,137 B2 | 5/2007 | Vadi et al. | |
| 7,224,184 B1 | 5/2007 | Levi et al. | |
| 7,233,532 B2 | 6/2007 | Vadi et al. | |

(Continued)

OTHER PUBLICATIONS

"SDAccel Environment User Guide," UG1023 (v2018.3), Xilinx, Inc., Jan. 24, 2019, p. 165.

*Primary Examiner* — Paul Dinh

(74) *Attorney, Agent, or Firm* — Kevin T. Cuenot

(57)     ABSTRACT

Bi-directional dynamic function exchange (DFX) can include receiving a circuit design for a programmable integrated circuit (IC). The circuit design includes a plurality of DFX partitions coupled by a signal path. The circuit design can be placed using a first plurality of DFX modules for the plurality of DFX partitions, in part, by selecting a flip-flop of a connection block as a boundary flip-flop of the signal path for each DFX module of the plurality of DFX modules. The circuit design including the signal path can be routed through the selected flip-flops of the connection blocks using a bi-directional routing resource coupling the plurality of connection blocks. The bi-directional routing resource is used as a partition pin placement constraint (PPLOC) node for DFX.

20 Claims, 12 Drawing Sheets

(56)                    References Cited

U.S. PATENT DOCUMENTS

| | | | |
|---|---|---|---|
| 7,235,999 B2 | 6/2007 | Goetting et al. | |
| 7,302,625 B1 | 11/2007 | Payakapan et al. | |
| 7,477,072 B1 | 1/2009 | Kao et al. | |
| 7,478,357 B1 | 1/2009 | Mason et al. | |
| 7,482,836 B2 | 1/2009 | Levi et al. | |
| 7,509,617 B1 | 3/2009 | Young | |
| 7,518,396 B1 | 4/2009 | Kondapalli et al. | |
| 7,546,572 B1 | 6/2009 | Ballagh et al. | |
| 7,599,299 B2 | 10/2009 | Goetting et al. | |
| 7,619,442 B1 | 11/2009 | Mason et al. | |
| 7,640,527 B1 | 12/2009 | Dorairaj et al. | |
| 7,724,815 B1 | 5/2010 | Raha et al. | |
| 7,746,099 B1 | 6/2010 | Chan et al. | |
| 8,102,188 B1 | 1/2012 | Chan et al. | |
| 8,359,448 B1 | 1/2013 | Neuendorffer | |
| 8,415,974 B1 | 4/2013 | Lysaght | |
| 8,719,750 B1 | 5/2014 | Balzli, Jr. | |
| 8,928,351 B1 | 1/2015 | Konduru | |
| 9,722,613 B1 | 8/2017 | Schultz et al. | |
| 10,296,699 B1 | 5/2019 | Yu et al. | |
| 10,558,777 B1 | 2/2020 | Yu et al. | |
| 10,608,641 B2 | 3/2020 | Yu et al. | |
| 10,621,299 B1 | 4/2020 | Yu et al. | |
| 10,651,853 B1 | 5/2020 | Kong et al. | |
| 2011/0153981 A1* | 6/2011 | Yancey | G06F 15/7867 |
| | | | 712/15 |
| 2021/0133107 A1* | 5/2021 | Schultz | G06F 12/0855 |

* cited by examiner

BI-DIRECTIONAL DYNAMIC FUNCTION EXCHANGE

TECHNICAL FIELD

This disclosure relates to programmable integrated circuits (ICs) and, more particularly, implementing bi-directional communication between multiple dynamic function exchange (DFX) regions of a programmable IC.

BACKGROUND

Dynamic function exchange (DFX), also referred to as partial reconfiguration, refers to a technology in which a designated region of a programmable IC is reconfigured to implement different circuitry therein or a different application therein over time while surrounding regions of the programmable IC continue to operate uninterrupted. The regions in which different circuitry and/applications are implemented over time are referred to as DFX regions. The surrounding regions that continue uninterrupted operation while circuitry in the DFX regions is changed may be referred as static regions.

In general, a circuit design intended to utilize DFX technology includes one or more DFX partitions, where each DFX partition, when implemented, creates a DFX region on the target programmable IC. Different DFX modules may be created that can be swapped into the DFX partitions of the circuit design. The DFX modules specify the different circuits that are implemented in the DFX regions over time.

In cases where two DFX modules are communicatively linked through a static region of circuitry, the connections used to create signal paths between the DFX modules are unidirectional. For example, a first DFX region that implements a driver coupled to a load in a second DFX region may not be reconfigured so that the signal path linking the driver and the load operates in the reverse direction. That is, updated circuitry in the second DFX region may not use the same signal path to drive a load included in updated circuitry in the first DFX region since the routing resources used to create the signal path only operate in the original direction from the first DFX region to the second DFX region.

SUMMARY

In one or more example implementations, a method includes receiving a circuit design for a programmable integrated circuit (IC). The circuit design includes a plurality of dynamic function exchange (DFX) partitions coupled by a signal path. The method includes placing the circuit design using a first plurality of DFX modules for the plurality of DFX partitions, in part, by selecting a flip-flop of a connection block as a boundary flip-flop of the signal path for each DFX module of the plurality of DFX modules. The method includes routing the circuit design including the signal path through the selected flip-flops of the connection blocks using a bi-directional routing resource coupling the connection blocks. The bi-directional routing resource is used as a partition pin location constraint (PPLOC) node for DFX.

The foregoing and other implementations can each optionally include one or more of the following features, alone or in combination. Some example implementations include all the following features in combination.

In some aspects, the routing, e.g., as performed using an implementation tool such as a router, includes routing the signal path from a driver of the signal path to a load of the signal path. Accordingly, the method can include performing an analysis on the routing of the circuit design to identify the bi-directional routing resource used to implement the signal path. The method can include, based on the analysis, selecting the bi-directional routing resource as the PPLOC node.

In some aspects, the routing includes selecting the bi-directional routing resource linking the selected flip-flops as the PPLOC node, setting a routing constraint to use the bi-directional routing resource for the signal path, and routing the signal path using the bi-directional routing resource based on the routing constraint.

In some aspects, the routing includes routing the signal path using the bi-directional routing resource in a first direction.

In some aspects, the method includes updating the circuit design with a second plurality of DFX modules for the plurality of DFX partitions and performing placement and routing for the second plurality of DFX modules using the PPLOC node.

In some aspects, the signal path coupling the second plurality of DFX modules uses the bi-directional routing resource.

In some aspects, the signal path coupling the second plurality of DFX modules using the bi-directional routing resource is routed in a second direction. The second direction is different than the first direction (e.g., in terms of signal flow).

In some aspects, the plurality of DFX partitions correspond to DFX regions located in different dies of the programmable IC. In some aspects, the plurality of DFX partitions correspond to DFX regions located in a same die of the programmable IC. In some aspects, the plurality of DFX partitions correspond to DFX regions located in different chiplets of an IC. The DFX regions may be implemented in and/or using different subsystems. For example, the DFX regions may include a portion of a data processing array, programmable circuitry, or the like.

In one or more example implementations, a system includes one or more hardware processors configured and/or programmed to initiate operations as described within this disclosure.

In one or more example implementations, a system includes a first DFX region. The system includes a second DFX region. The system includes a bi-directional routing resource communicatively linking first circuitry implemented in the first and second DFX regions in a first direction. The system may be a programmable IC. The programmable IC may include a single die or a plurality of interconnected dies.

In some aspects, the first and second DFX regions are reconfigurable to implement second circuitry that communicates using the bi-directional routing resource in a second and different direction.

In some aspects, the first and second DFX regions are disposed in different dies or in different chiplets.

In one or more example implementations, a computer program product includes one or more computer readable storage mediums having program instructions embodied therewith. The program instructions are executable by computer hardware, e.g., a hardware processor, to cause the computer hardware to initiate and/or execute operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 12 illustrates an example implementation of an IC including a plurality of chiplets.

DETAILED DESCRIPTION

Figure 1:
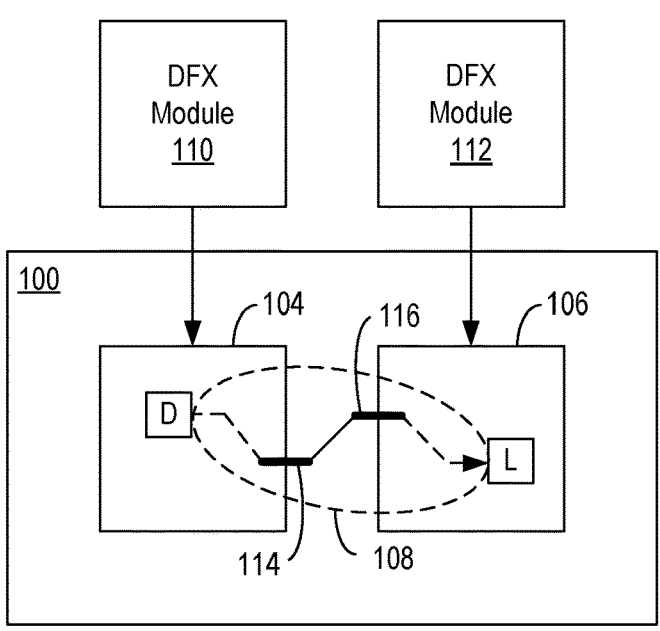
FIGS. 1 and 2 illustrate an example of a conventional approach for implementing a signal path between dynamic function exchange (DFX) regions of a programmable integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to programmable integrated circuits (ICs) and, more particularly, implementing bi-directional communication between multiple dynamic function exchange (DFX) regions of a programmable IC. A variety of different circuit designs implement a plurality (e.g., two or more) DFX regions on a programmable IC where the DFX regions are linked by one or more signal paths. In the conventional case, unidirectional wires of the programmable fabric of the programmable IC have been used to implement each signal path linking the plurality of DFX regions. This means that for the signal path routed using the unidirectional wire, communication may only flow in one direction. Such is the case no matter the different types of circuitry implemented in the respective DFX regions connected by the signal paths over time. Different circuitry implemented in the DFX regions is not permitted to utilize the signal paths to communicate in a different, e.g., opposite, direction.

For example, communicating from a driver of a first DFX region to a load of a second DFX region, and from a driver of the second DFX region to a load of the first DFX region has required two distinct signal paths (e.g., wires). The two different signal paths have been required regardless of whether the communication between the two DFX regions occurred in both directions simultaneously or only in a first direction for a first configuration of the DFX regions and then in a second, different direction subsequent to a reconfiguration of the DFX regions of the programmable IC using a second and different configuration.

In accordance with the inventive arrangements described within this disclosure, DFX-enabled circuit designs are able to support bi-directional boundary paths among different DFX (e.g., reconfigurable) partitions. The inventive arrangements provide greater flexibility for DFX-enabled circuit designs and extend the usage of such circuit designs to a greater number of users. In one or more aspects, a plurality of DFX regions of a programmable IC that are linked by a signal path may be routed using a bi-directional routing resource. The bi-directional routing resource does not support concurrent bi-directional communication. Rather, the bi-directional routing resource may be used to convey signals in a first direction for a first configuration of the DFX regions of the programmable IC and then convey signals in a second and different direction for a second and different configuration of the DFX regions of the programmable IC.

The bi-directional routing resource conveys signals in one direction at a time for a given configuration of the DFX regions of the programmable IC. Still, where previously two signal paths were required, in accordance with the inventive arrangements, only one signal path is required thereby saving resources of the programmable IC. Moreover, fewer constraints are required to process the DFX-enabled circuit designs through design flows thereby reducing runtime of the computer-based implementation tools.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 2:
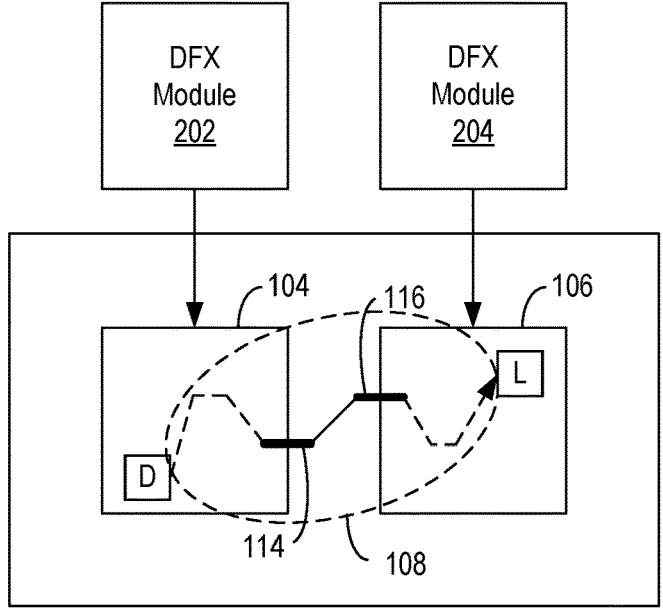

FIGS. 1 and 2 illustrate an example of a conventional approach for implementing a signal path between DFX regions of a programmable IC. A programmable IC is an IC that includes at least some programmable circuitry. Programmable logic is a type of programmable circuitry. Examples of programmable ICs may include, but are not limited to, Field Programmable Gate Arrays (FPGAs), System-on-Chips (SoCs) having at least some programmable circuitry, and/or Application-Specific ICs (ASICs) having at least some programmable circuitry. Programmable logic is a type of programmable circuitry.

Referring to FIG. 1, a programmable IC 100 includes DFX region 104 and a DFX region 106. DFX region 104 is linked to DFX region 106 by a signal path 108. A DFX-enabled circuit design implemented in programmable IC 100 may include two DFX partitions. Each DFX partition of the circuit design corresponds to, e.g., creates when implemented, one of DFX regions 104, 106. Different DFX modules, each specifying a particular and/or different circuit design, may be included in the DFX partitions, processed through a design flow, and be implemented in respective DFX regions 104, 106 of programmable IC 100. In the example, the circuitry implemented in DFX region 104 corresponds to a first DFX partition in which DFX module 110 is included. The circuitry implemented in DFX region 106 corresponds to a second DFX partition in which DFX module 112 is included.

In the example, signal path 108 links a driver D of DFX region 104 with a load L of DFX region 106. Signal path 108 includes a portion that is within DFX region 104, a portion within DFX region 106, and a portion that connects DFX region 104 with DFX region 106. In general, the portions of signal path 108 disposed in DFX region 104 and DFX region 106 are shown with dashed lines. The portion of signal path 108 between DFX region 104 and DFX region 106 is shown with a solid and un-bolded line. The solid and un-bolded part of signal path 108 is included in what is referred to as static circuitry. The solid and un-bolded part of signal path 108 does not change despite implementing different circuitry into each respective DFX region 104, 106.

Each of the bolded portions of signal path 108 represents a partition pin placement constraint (PPLOC) node. A PPLOC is a design constraint that designates a particular resource, e.g., node, of a programmable IC as an unchanging boundary between a DFX region and circuitry external to that DFX region (e.g., static circuitry). In this regard, a PPLOC may be specified as a data structure that is interpretable by one or more circuit design implementation tools in implementing (e.g., physically realizing) a circuit design as occurs in executing a design flow. A PPLOC node refers to a particular node of the programmable IC to which the PPLOC is applied or otherwise associated. In the case of a PPLOC node, such a node may force a router to utilize the node to route a give signal path.

As shown, a PPLOC node exists for each DFX region. As illustrated, PPLOC node 114 is located on a boundary of DFX region 104 while PPLOC node 116 is located on a boundary of DFX region 106. Each PPLOC node is a routing resource, e.g., wire, of programmable IC 100 that is located on a boundary of a DFX region that marks the point of ingress or egress of a signal for the DFX region. Like the portion of signal path 108 that connects the PPLOC nodes through the static region, the PPLOC nodes do not change from one implementation of a DFX module to another within the DFX regions. PPLOC node 114 is the point of egress of signal path 108 from DFX region 104 while PPLOC node 116 is the point of ingress of signal path 108 into DFX region 106. Since the routing resources used to establish the portion of signal path from PPLOC node 114 to PPLOC node 116 are unidirectional, signal path 108 has a particular signal direction that flows from driver D to load L.

Referring to FIG. 2, programmable IC 100 has been reconfigured with a different configuration so that DFX region 104 implements DFX module 202 and DFX region 106 implements DFX module 204. In the example, the direction of signal path 108 remains unchanged. Further, the exact PPLOC node (e.g., wire or routing resource used as a PPLOC node) does not change. That is, each of PPLOC node 114 and PPLOC node 116 is the same routing resource from the example of FIG. 1. Further, the routing resources of the static region that connect PPLOC node 114 and PPLOC node 116 are the same. Those routing resources that connect driver D within DFX region 104 to PPLOC node 114 and those routing resources that connect load L within DFX region 106 to PPLOC node 116 have changed as a consequence of reconfiguration.

In the examples of FIGS. 1 and 2, the direction of signal path 108 is the same from one configuration of programmable IC 100 to another. If, for example, a signal path flowing in the direction from DFX region 106 to DFX region 104 were desired, regardless of whether that signal path would be in addition to signal path 108 or as a replacement of signal path 108, such other signal path would have to be implemented independently of signal path 108. That is, if signal path 108 flowed from DFX region 104 to DFX region 106 in the example of FIG. 1, and there was a desire to have signal path 108 flow from DFX region 106 to DFX region 104 in the example of FIG. 2, this would require a completely different signal path. That different signal path would have a set of PPLOC nodes (e.g., one for each DFX region). The implementation tools would need to accommodate this architecture. That is, the ability to have signal paths flowing in both directions would require the additional resources of two independent signal paths and the additional runtime time required to handle twice the number of PPLOC nodes and process (e.g., place and route) such nodes.

Figure 3:
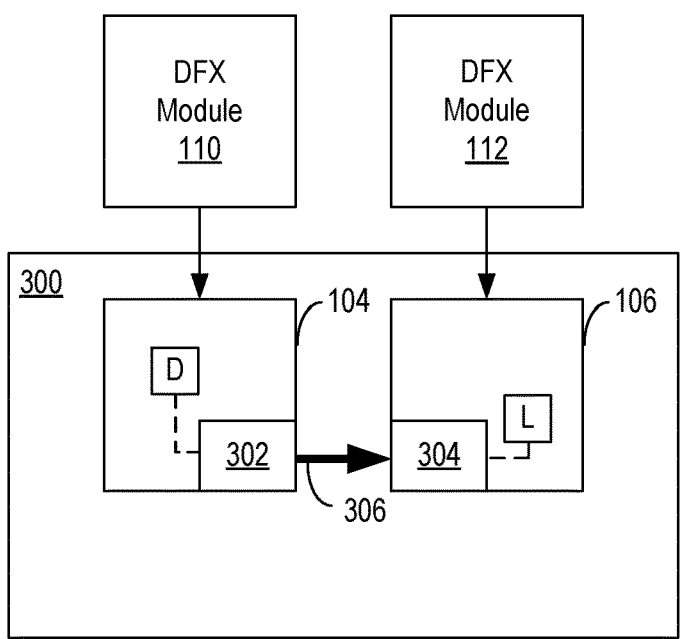
FIGS. 3 and 4 illustrate an example technique for implementing bi-directional boundary paths for DFX-enabled circuit designs.
Figure 4:
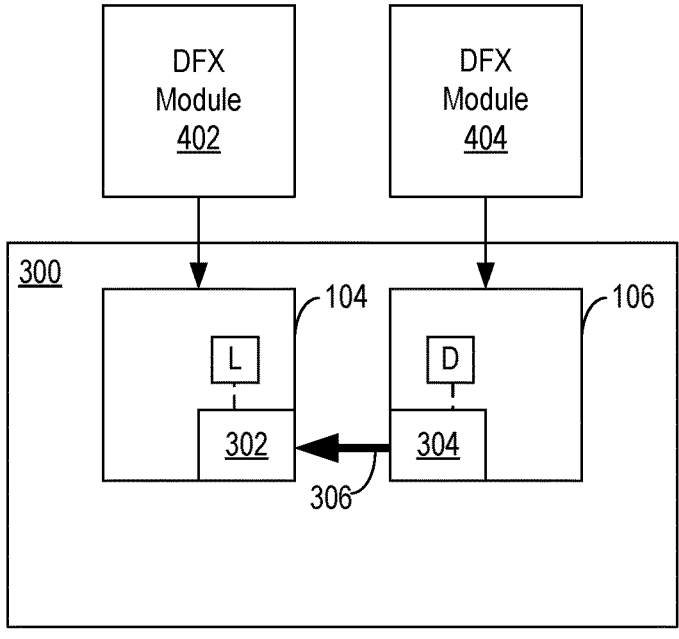
Figure 8:
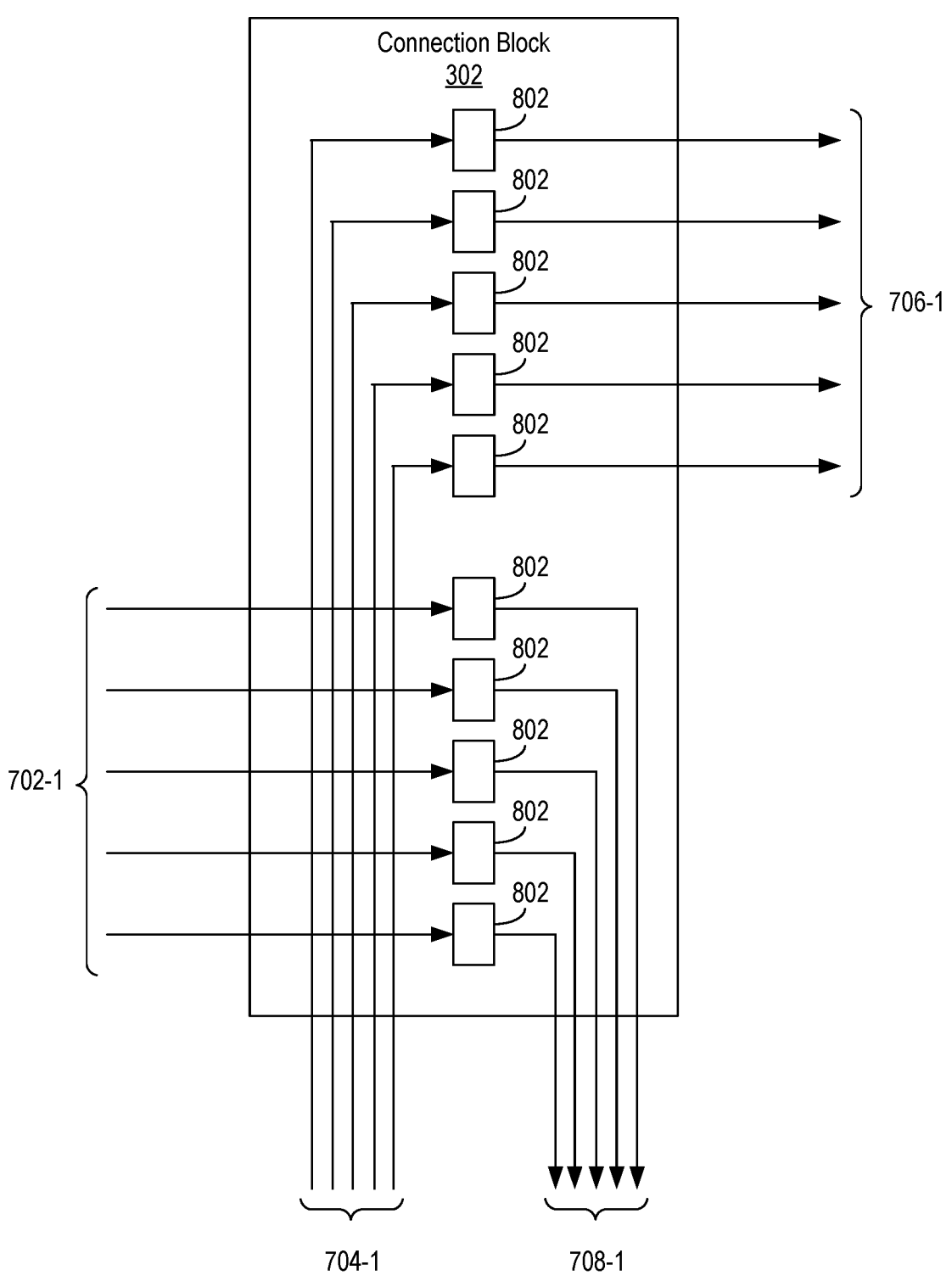
FIG. 8 illustrates an example implementation of a connection block.

FIGS. 3 and 4 illustrate an example technique for implementing bi-directional boundary paths for DFX-enabled circuit designs. In the example of FIGS. 3 and 4, programmable IC 300 is illustrated. Within programmable IC 300, a signal path communicatively linking DFX regions is shown implemented using a bi-directional routing resource. In the example, DFX region 104 includes a driver D that is communicatively linked to a connection block 302 by routing resources disposed within DFX region 104. DFX region 106 includes a load L that is communicatively linked to a connection block 304 by routing resources disposed within DFX region 106. In the example, connection block 302 is communicatively linked to connection block 304 by a bi-directional routing resource 306. In the example of FIGS. 3 and 4, bi-directional routing resource 306 is used as the PPLOC node. In one or more example implementations, connections blocks may be implemented as Laguna blocks or sites. An example connection block is illustrated in FIG. 8.

Each of connection block 302 and connection block 304 is configured to receive one or more signals as inputs and to convey one or more signals as outputs. That is, signals may enter and exit each of connection block 302 and connection block 304. Bi-directional routing resource 306 may be implemented as a super long line or a "Laguna" super long line (e.g., a wire also referred to as an "SLL"). In this respect, bi-directional routing resource 306 is implemented as a single wire or line.

Referring to FIG. 3, in a first configuration of programmable IC 300 in which DFX module 110 is implemented in DFX region 104 and DFX module 112 is implemented in DFX region 106, driver D within DFX region 104 drives load L within DFX region 106 by way of bi-directional routing resource 306. Accordingly, bi-directional routing resource 306 has a direction that flows from driver D in DFX region 104 to load L in DFX region 106 as shown.

Referring to FIG. 4, in a second and different configuration of programmable IC 300 in which DFX module 402 is implemented in DFX region 104 and DFX module 404 is implemented in DFX region 106, driver D within DFX region 106 drives load L within DFX region 104 by way of bi-directional routing resource 306. Accordingly, bi-directional routing resource 306 has a direction that flows from driver D in DFX region 106 to load L in DFX region 104 as shown. The direction of the signal path through bi-directional routing resource 306 changes from that of FIG. 3 to that of FIG. 4. This change in direction of signal flow through bi-directional routing resource 306, unlike the example of FIGS. 1 and 2, does not require the creation of a new and independent data path between DFX region 104 and DFX region 106. Rather, the original signal path used in FIG. 3, e.g., the particular bi-directional routing resource 306, may be reconfigured to convey signals in the opposite direction in the example of FIG. 4.

In the example of FIGS. 3 and 4, programmable IC 300 may be implemented using a single die within a single package or using multiple interconnected dies disposed in a single package. In the example of FIGS. 3 and 4, regardless of the implementation of programmable IC 300, connection block 302 and connection block 304 (and optionally one or more other connection blocks) are disposed in a same die. That is, one or more dies of programmable IC 300 include a plurality of connection blocks on a same die that are communicatively linked by one or more bi-directional routing resources.

In one or more example implementations described within this disclosure, the connection blocks used at opposing ends of a bi-directional routing resource may be included in separate DFX partitions and, as such, in separate DFX regions. The bi-directional routing resource (e.g., wire) itself may be considered a PPLOC node and static circuitry.

Figure 5:
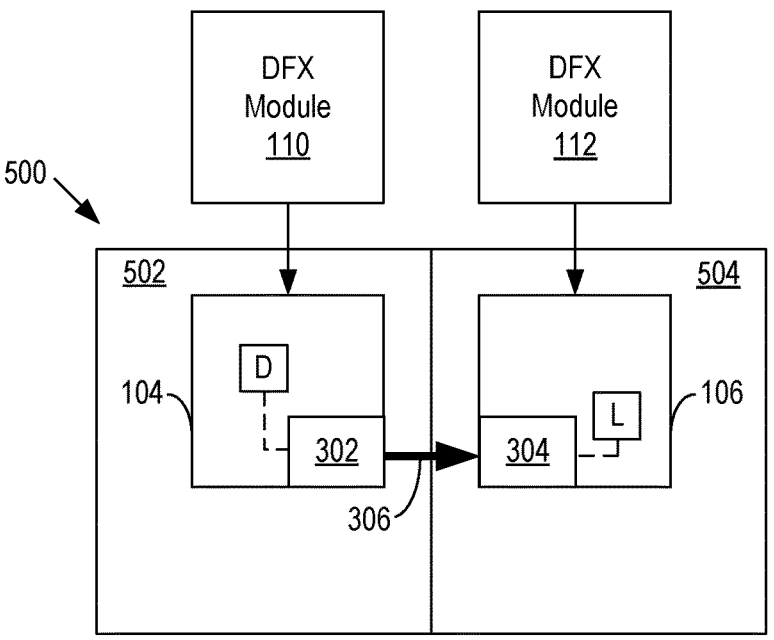
FIGS. 5 and 6 illustrate another example technique for implementing bi-directional boundary paths for DFX-enabled circuit designs.
Figure 6:
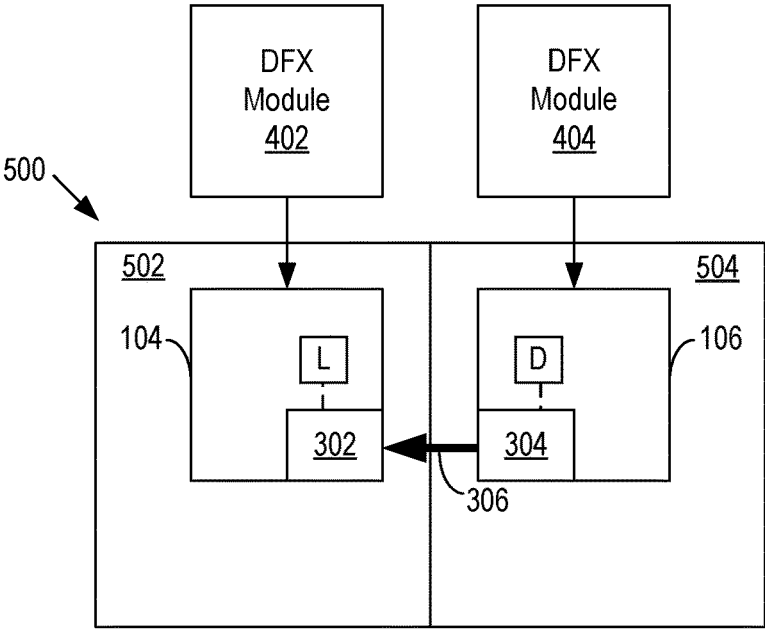

FIGS. 5 and 6 illustrate another example technique for implementing bi-directional boundary paths for DFX-enabled circuit designs. In the example of FIGS. 5 and 6, programmable IC 500 is illustrated. Programmable IC 500 is implemented as a multi-die IC having a die 502 and a die 504. Dies 502, 504 may also be referred to as "super logic regions" or "SLRs." Die 502 and die 504 are communicatively linked using any of a variety of available die interconnection technologies. In one example, dies 502 and 504 are connected by way of an interposer using stacked die silicon interconnect technology. For example, in one or more example implementations, bi-directional routing resource 306 may traverse through an interposer on which die 502 and die 504 are mounted. Bi-directional routing resource 306 may be coupled to a circuit node within die 502 and a circuit node within die 504. In this regard, the example of FIGS. 5 and 6 is substantially similar to that of FIGS. 3 and 4 with the exception that bi-directional routing resource 306 spans, or couples, two different dies. Further, with bi-directional routing resource 306 being an inter-die communication link, bi-directional routing resource 306 may be disposed in an interposer instead of being disposed in the same die that includes DFX region 104 and DFX region 106 as was the case in the examples of FIGS. 3 and 4.

Figure 7:
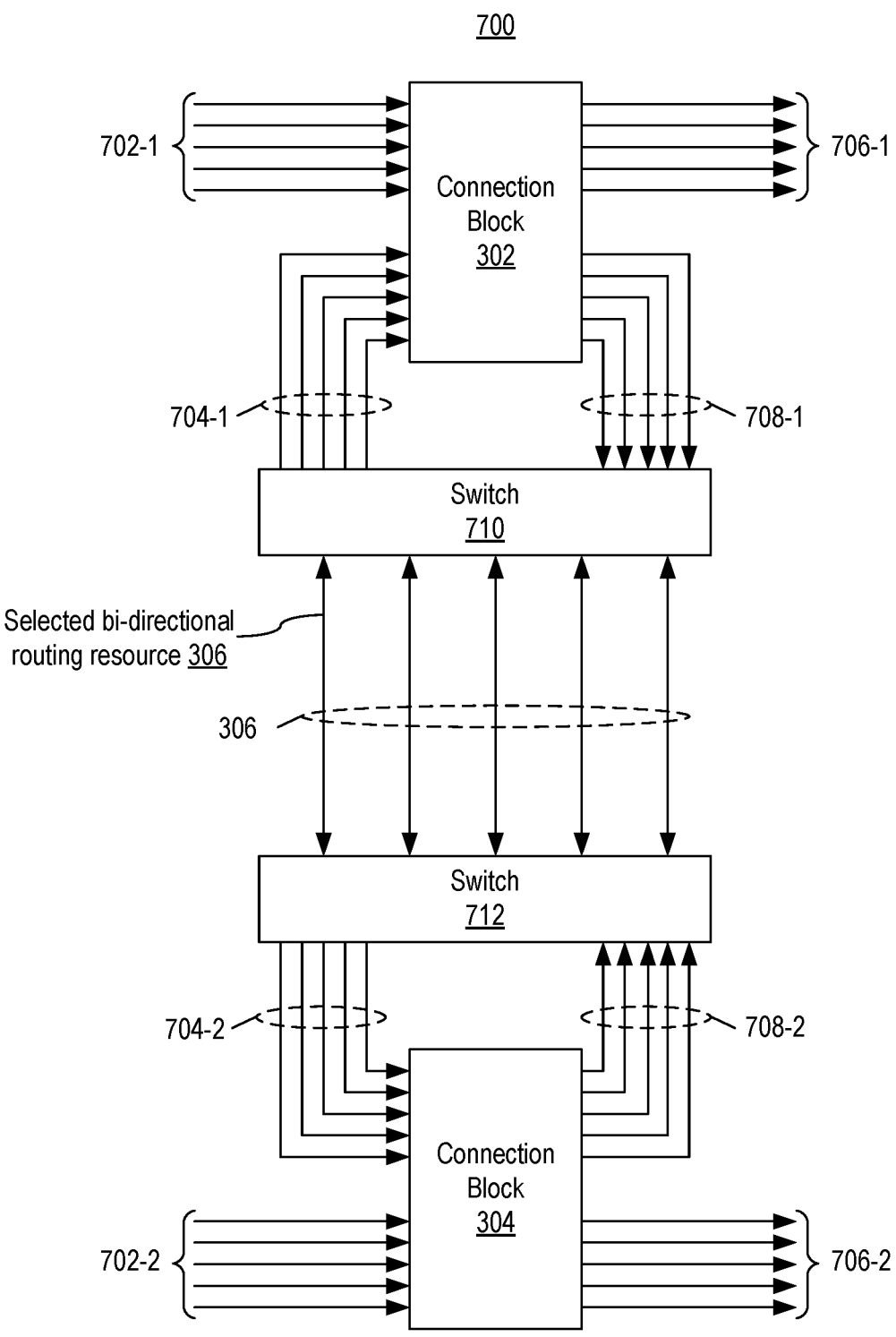
FIG. 7 illustrates an example circuit architecture that supports bi-directional boundary paths for DFX-enabled circuit designs.

FIG. 7 illustrates an example circuit architecture 700 that supports bi-directional boundary paths for DFX-enabled circuit designs. In the example, connection block 302 and connection block 304 are illustrated. Connection block 302 and connection block 304 may be located in a same die or in different dies as described.

In the example, each connection block is configured to receive a plurality of input signals and convey a plurality of output signals. For example, connection block 302 receives one or more input signals 702-1 conveyed over respective wires and one or more input signals 704-1 conveyed over respective wires. Input signals 702-1 are signals received from circuitry of the programmable IC other than another connection block. Input signals 704-1 are signals received from another connection block (e.g., connection block 304). Similarly, connection block 304 receives one or more input signals 702-2 conveyed over respective wires and one or more input signals 704-2 conveyed over respective wires. Input signals 702-2 are signals received from circuitry of the programmable IC other than another connection block. Input signals 704-2 are signals received from another connection block (e.g., connection block 302).

Connection block 302 conveys one or more output signals 706-1 over respective wires and one or more output signals 708-1 over respective wires. Output signals 706-1 are signals conveyed to circuitry of the programmable IC other than another connection block. Output signals 708-1 are signals conveyed to another connection block (e.g., connection block 304). Similarly, connection block 304 conveys one or more output signals 706-2 over respective wires and one or more output signals 708-2 over respective wires. Output signals 706-2 are signals conveyed to circuitry of the programmable IC other than another connection block. Output signals 708-2 are signals conveyed to another connection block (e.g., connection block 302).

In the example, connection block 302 is coupled to a switch 710. Connection block 304 is coupled to switch 712. Switch 710 receives signals 708-1 from connection block 302 and outputs signals 704-1 to connection block 302. Switch 712 receives signals 708-2 from connection block 304 and outputs signals 704-2 to connection block 304. Switch 710 and switch 712 are coupled by one or more bi-directional routing resources 306.

In the example of FIG. 7, signals 702, 704, 706, 708, and 306 are shown as being implemented to include 5 signals. It should be appreciated that each of the respective signal groupings may include fewer or more than 5 signals. The number of signals illustrated is for purposes of illustration and not limitation.

In one or more examples, switch 710 is configurable in the field to route signals received on any one of bi-directional routing resources 306 to any one of signals 704-1 and to route any one of signals 708-1 to any one of bi-directional routing resources 306. Similarly, switch 712 is configurable in the field to route signals received on any one of bi-directional routing resources 306 to any one of signals 704-2 and to route any one of signals 708-2 to any one of bi-directional routing resources 306.

In a first configuration as illustrated in FIG. 3 or 5, the signal path from DFX region 104 to DFX region 106 may flow through a signal 702-1, through connection block 302, through a signal 708-1, through switch 710, through a selected bi-directional routing resource 306, through switch 712, through a signal 704-2, through connection block 304, and out through a signal 706-2 to DFX region 106. In a second configuration as illustrated in FIG. 4 or 6, the signal path from DFX region 106 to DFX region 104 may flow through a signal 702-2, through connection block 304, through a signal 708-2, through switch 712, through the selected bi-directional routing resource 306 (e.g., the same bi-directional routing resource 306 as used in the first configuration), through switch 710, through a signal 704-1, through connection block 302, and out through a signal 706-1 to DFX region 106.

In one or more example implementations, depending on the particular architecture of the programmable IC used, a connection block may be included with a corresponding switch within a tile of the programmable IC. For example, connection block 302 and switch 710 may be disposed in a same tile, while connection block 304 and switch 712 are disposed in a different tile. In some examples, switches 710, 712 may be implemented as switch boxes within the respective tiles that include connection blocks.

FIG. 8 illustrates an example implementation of a connection block. For purposes of illustration, FIG. 8 depicts connection block 302. In the example, inputs to connection block 302 are illustrated as entering on the left side and are coupled to flip-flops 802. Outputs are illustrated as exiting on the right side from flip-flops 802.

Figure 9A:
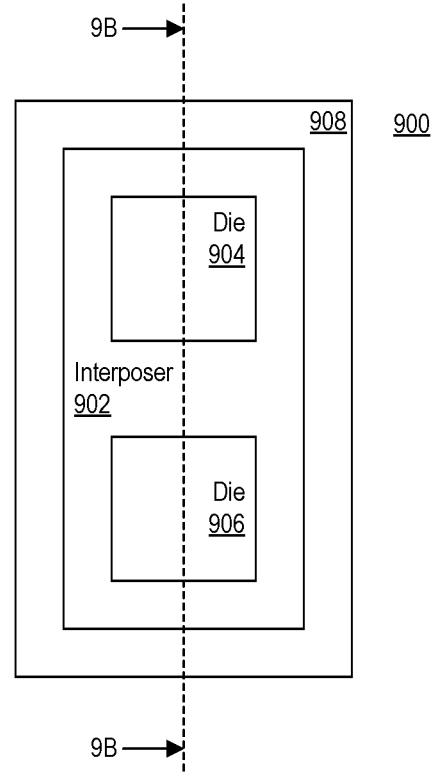
FIGS. 9A and 9B, taken collectively, illustrate an example implementation of a multi-die IC.
Figure 9B:
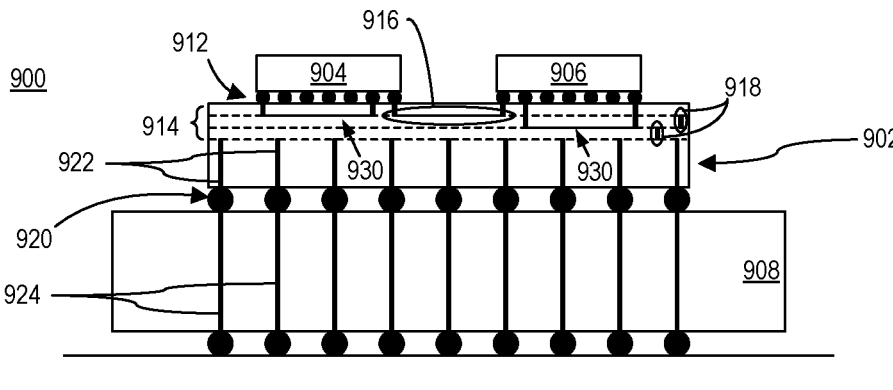

FIGS. 9A and 9B, taken collectively, illustrate an example implementation of a multi-die IC (IC) 900. For purposes of discussion, FIGS. 9A and 9B may be referred to collectively as "FIG. 9." Within this disclosure, the term "multi-die IC" means an IC implemented to include two or more dies communicatively linked and included within a single package.

FIG. 9A illustrates a topographical view of IC 900. In the example of FIG. 9A, IC 900 is implemented as a "stacked die" type of device formed by stacking multiple dies. IC 900 includes an interposer 902, a die 904, a die 906, and a package substrate 908. Each of dies 904 and 906 is attached to a surface, e.g., a top surface, of interposer 902. In one aspect, dies 904 and 906 are attached to interposer 902 using flip-chip technology. Interposer 902 is attached to a top surface of package substrate 908.

In general, interposer 902 is an intermediate die disposed between dies 904, 906 and package substrate 908. Interposer 902 is implemented to provide interconnection, routing, and/or a ground/power plane. Package substrate 908 provides the package with mechanical base support and provides an electrical interface for connecting to nodes external to the package.

In the example of FIG. 9A, interposer 902 is a die having a planar surface on which dies 904 and 906 are horizontally stacked. As shown, dies 904 and 906 are located on the planar surface of interposer 902 side-by-side. The number of dies shown on interposer 902 in FIGS. 9A and 9B is for purposes of illustration and not limitation. In other example implementations, more than two dies may be mounted on interposer 902.

Interposer 902 provides a common mounting surface and electrical coupling for each of dies 904 and 906. The manufacturing of interposer 902 may include one or more process steps that allow the deposition of one or more conductive layers that are patterned to form wires. These conductive layers may be formed of aluminum, gold, copper, nickel, various silicides, and/or other suitable material. Interposer 902 may be manufactured using one or more additional process steps that allow the deposition of one or more dielectric or insulating layer(s) such as, for example, silicon dioxide. Interposer 902 also may include vias and through vias (TVs). TVs may be through silicon vias (TSVs), through glass vias (TGVs), or other via structures depending upon the particular materials used to implement interposer 902 and the substrate thereof. Interposer 902 may have various types of solder bumps, vias, wires, TVs, and under bump metallization (UBM). In one aspect, interposer 902 is implemented as a passive die that does not include active circuitry. In the case where interposer 902 is implemented as an active die, interposer 902 may include additional process layers forming one or more active devices in reference to electrical devices such as transistors, diodes, etc., that include P-N junctions.

FIG. 9B is a cross-sectional side view of IC 900 of FIG. 9A. FIG. 9B illustrates a view of IC 900 from FIG. 9A taken along cut-line 9B-9B. Each of dies 904 and 906 is electrically and mechanically coupled to a first planar surface of interposer 902 via solder bumps 912. In one example, solder bumps 912 are implemented as micro-bumps. Still, any of a variety of other techniques may be used to attach dies 904 and 906 to interposer 902. For example, bond wires or edge wires may be used to mechanically and electrically attach dies 904 and 906 to interposer 902. In another example, an adhesive material may be used to mechanically attach dies 904 and 906 to interposer 902. The attachment of dies 904 and 906 to interposer 902 using solder bumps 912, as illustrated within FIG. 9B, is provided for purposes of illustration and is not intended as a limitation.

Interposer 902 includes one or more conductive layers 914 illustrated as dashed or dotted lines in interposer 902. Conductive layers 914 are implemented using any of a variety of metal layers such as those previously described. Conductive layers 914 are processed to form patterned metal layers that implement wires 916, 930 of interposer 902. A wire that couples at least two different dies, e.g., dies 904 and 906, is referred to as an inter-die wire. In the example of FIG. 9B, wires 916, formed of the patterned metal layers 914 within interposer 902, are inter-die wires. Wires 916 pass inter-die signals between dies 904 and 906. For example, each of wires 916 couples a solder bump 912 beneath die 904 with a solder bump 912 beneath die 906, thereby allowing the exchange of inter-die signals between dies 904 and 906. Wires 916 may be data wires. In another aspect, wires 916 may include one or more power wires. A power wire may be a wire carrying a voltage potential or a wire having a ground or reference voltage potential.

One or more of wires 916 may be implemented as bi-directional routing resources 306 that couple on each end to a connection block located in each respective die 904, 906. For example, bi-directional routing resource 306 as implemented in the examples of FIGS. 5 and 6 may be implemented as wire 916.

Wires 930 are examples of intra-die wires. For example, one of wires 930 couples a solder bump 912 beneath die 904 with another solder bump 912 beneath die 904, thereby allowing the exchange of signals solely within die 904. Another of wires 930 couples a solder bump 912 beneath die 906 with another solder bump 912 beneath die 906, thereby allowing the exchange of signals solely within die 906. One or more of wires 930 may be implemented as a bi-directional routing resource 306 that is coupled on each end to a connection block. For example, though bi-directional routing resource 306 of FIGS. 3 and 4 may be implemented within the die including programmable circuitry, in another example, bi-directional routing resource 306 of FIGS. 3 and 4 may be implemented in interposer 902 as wire 930.

It should be appreciated that the number of wires 916, 930 illustrated in FIG. 9 is for purposes of illustration and fewer or more of each such type of wire may be included.

Different ones of conductive layers 914 and wires 916 may be coupled together using vias 918. In general, a via structure is used to implement a vertical conductive path. A vertical conductive path refers to a conductive path that is perpendicular to a process layer of the device. In this regard, the vertical portions of wires 916 that contact solder bumps 912 are implemented as vias 918. The use of multiple conductive layers to implement interconnects within interposer 902 allows a greater number of signals to be routed and more complex routing of signals to be achieved within interposer 902.

TVs 922 are vias that form an electrical connection that vertically transverses, e.g., extends through a substantial portion, if not the entirety of, interposer 902. TVs 922, like wires and vias, may be formed of any of a variety of different conductive materials including, but not limited to, copper, aluminum, gold, nickel, various silicides, and/or other suitable materials. As pictured, each of TVs 922 extends from a bottom surface of interposer 902 up to a conductive layer 914 of interposer 902. TVs 922 further may be coupled to a solder bump 912 through one or more of conductive layers 914 in combination with one or more vias 918.

Solder bumps 920 can be used to mechanically and electrically couple a second planar surface of interposer 902 to package substrate 908. In particular example implementations, solder bumps 920 are implemented as controlled collapse chip connection (C4) balls. Package substrate 908 includes conductive paths 924 that couple different ones of solder bumps 920 to one or more nodes beneath package substrate 908 and to other circuit structures such as a circuit board. Accordingly, one or more of solder bumps 920 couple circuitry within interposer 902 to nodes external to IC 900 through circuitry or wiring within package substrate 908.

In the example of FIG. 9, each of dies 904 and 906 may be used to implement any of a variety of different types of subsystems (e.g., circuits). Examples of different subsystems include, but are not limited to, a processor subsystem, a programmable circuitry (e.g., programmable logic) subsystem, a data processing array subsystem, or an Application-Specific IC (ASIC).

Figure 10:
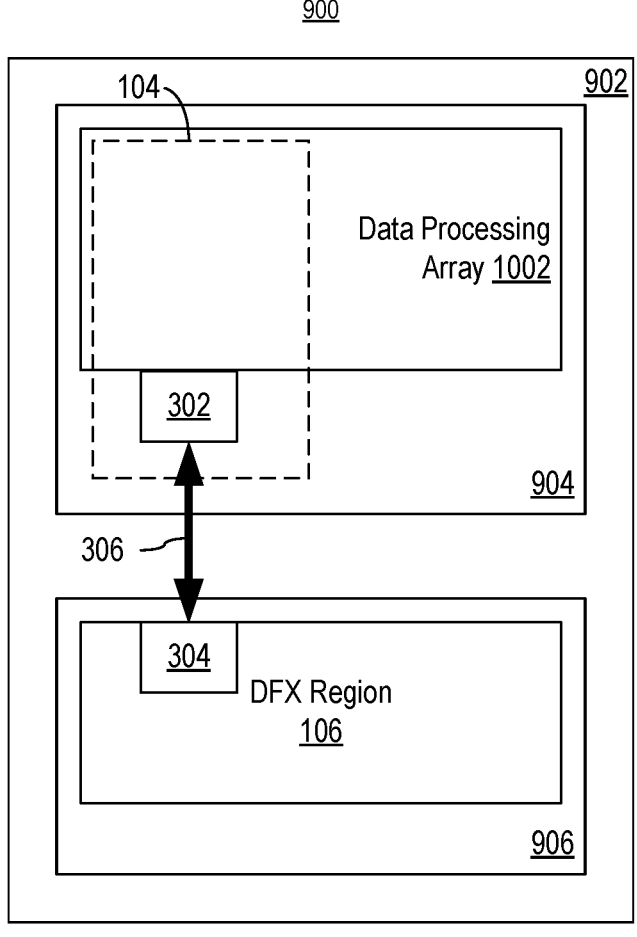
FIG. 10 illustrates an example implementation of the multi-die IC of FIG. 9 including a data processing array and programmable circuitry.

FIG. 10 illustrates an example implementation of multi-die IC 900 including a data processing array 1002 and programmable circuitry. In the example, die 904 is used to implement a data processing array 1002. Data processing array 1002 may be considered another example of programmable circuitry in that data processing array 1002 may implement one or more different applications therein over time within a portion of the array designated as a DFX region.

As shown, data processing array 1002 couples to connection block 302. DFX region 104 is defined in die 904 that includes at least a portion of data processing array 1002 and connection block 304. Die 906 is used to implement programmable circuitry (e.g., programmable logic). DFX region 106 is defined in die 906 and includes connection block 304. In this example, DFX region 104 is connected to DFX region 106 by way of bi-directional routing resource 306, which may be designated as a PPLOC node. In this example, bi-directional routing resource 306 is physically implemented in interposer 902 as an inter-die wire.

Figure 11:
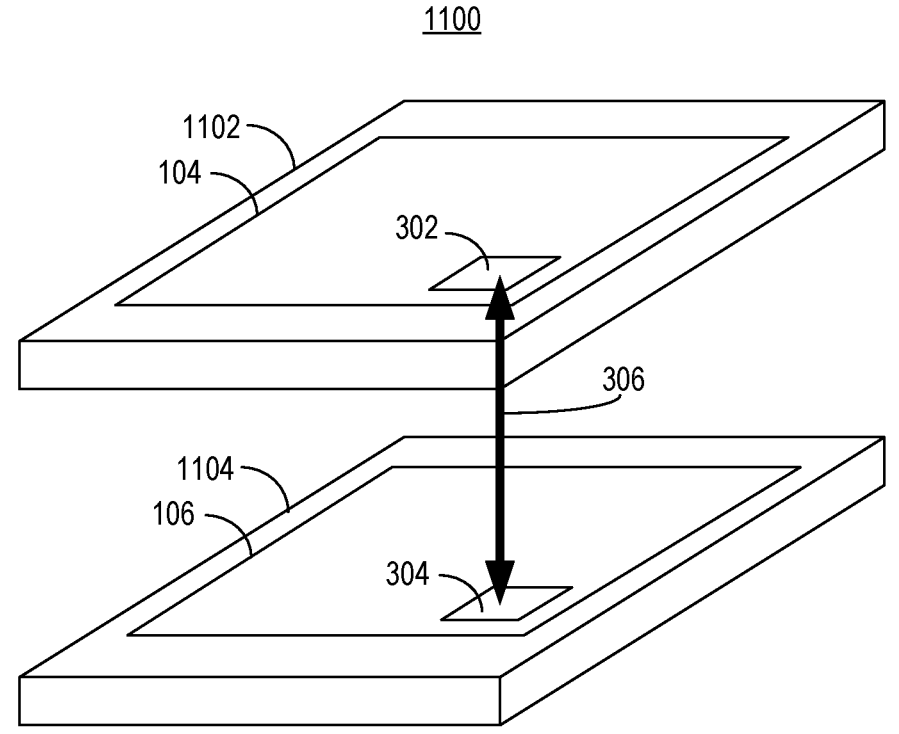
FIG. 11 illustrates another example of a multi-die IC implemented using a 3-dimensional IC technology in which the dies are stacked.

FIG. 11 illustrates another example of a multi-die IC 1100 implemented using a 3-dimensional IC technology in which the dies are stacked. In the example of FIG. 11, die 1102 includes DFX region 104 and die 1104 includes DFX region 106. DFX region 104 includes connection block 302 while DFX region 106 includes connection block 304. In the example, bi-directional routing resource 306 may be implemented as a connection that is oriented perpendicular to the planar surface of each of dies 1102, 1104. In one or more examples, bi-directional routing resource 306 may be implemented as a signal path (e.g., wire) formed of TVs. The example IC architecture of FIG. 11 omits an interposer.

In the example of FIG. 11, each of dies 1102 and 1104 may include programmable circuitry (e.g., programmable logic). In that case, DFX region 104 and DFX region 106 each may include programmable logic with bi-directional routing resource 306 being designated as the PPLOC node implemented as a vertical connection as static circuitry.

In another example, one of dies 1102, 1104 may include data processing array 1002. In that case, one DFX region may include programmable circuitry (e.g., programmable logic) while the other DFX region includes a portion of data processing array 1002.

Figure 12:
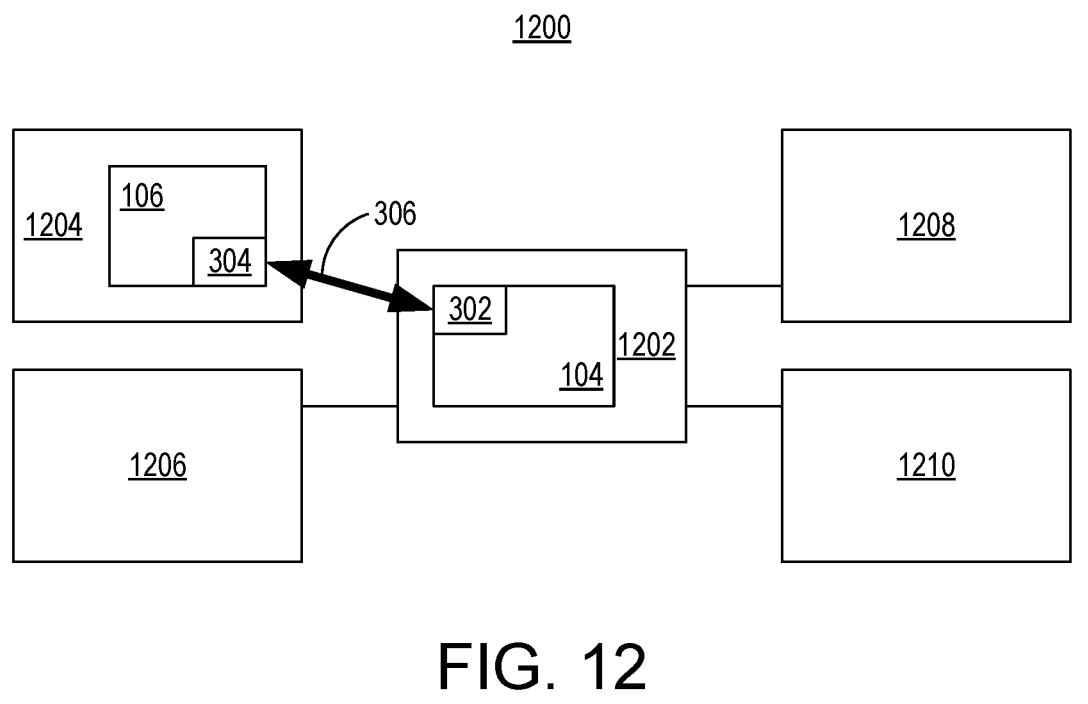

FIG. 12 illustrates an example implementation of an IC 1200 including a plurality of chiplets. In the example, IC 1200 includes chiplets 1202, 1204, 1206, 1208, and 1210. In the example of FIG. 12, chiplet 1202 includes DFX region 104 and chiplet 1204 includes DFX region 106. DFX region 104 includes connection block 302 while DFX region 106 includes connection block 304. In the example, while the chiplets may be coupled by any of a variety of different types of wires and/or routing resources, chiplet 1202 and chiplet 1204 and, more particularly, DFX region 104 and DFX region 106, are connected using bi-directional routing resource 306.

In the example of FIG. 12, each of chiplets 1202, 1204 may include programmable circuitry (e.g., programmable logic). In that case, DFX region 104 and DFX region 106 each may include programmable logic with bi-directional routing resource 306 being designated as the PPLOC node. In another example, one of chiplets 1202, 1204 may include data processing array 1002. In that case, one chiplet may include programmable circuitry (e.g., programmable logic) while the other chiplet includes a portion of data processing array 1002.

Figure 13:
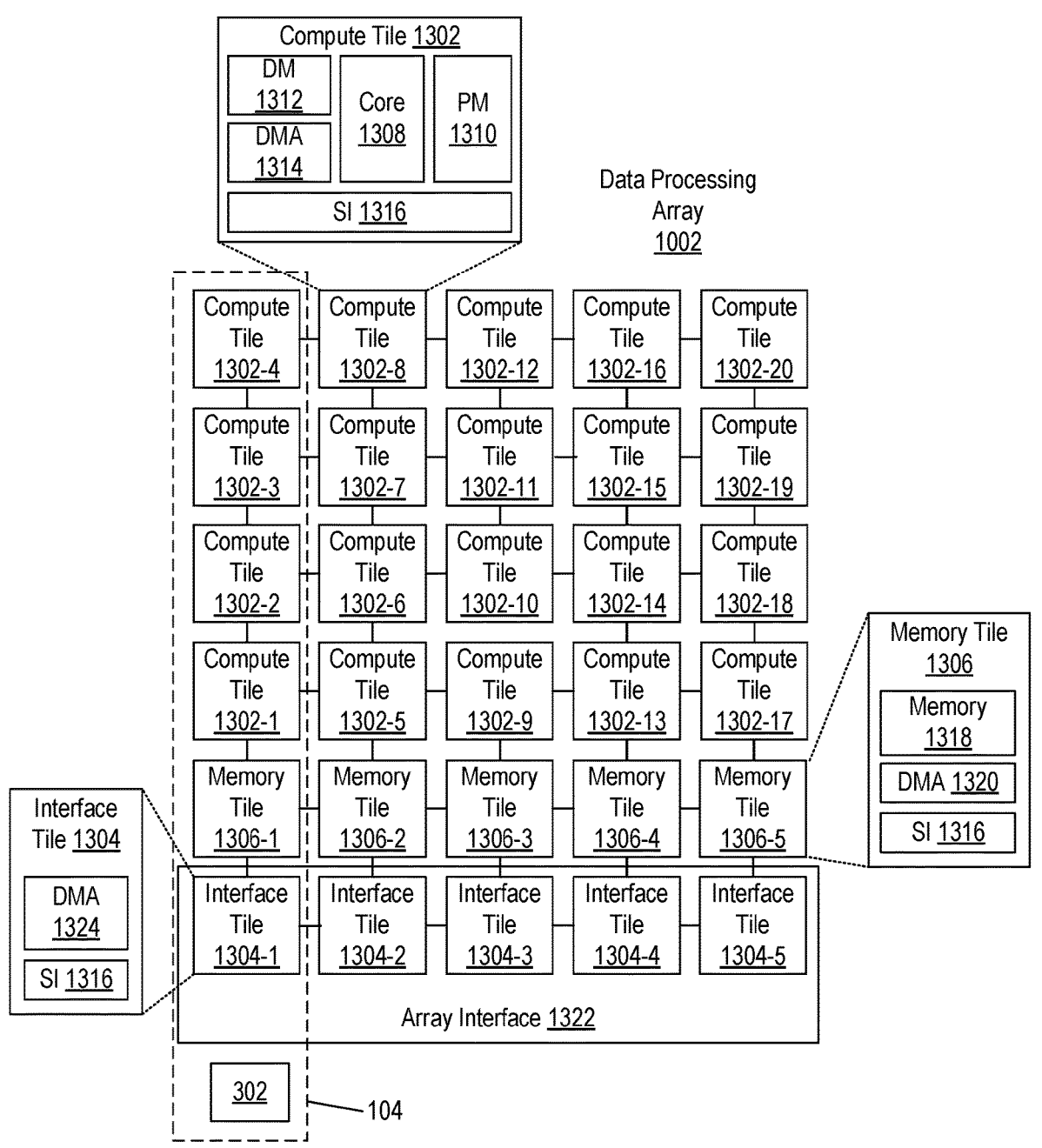
FIG. 13 illustrates an example implementation of a data processing array coupled to a connection block.

FIG. 13 illustrates an example implementation of data processing array 1002 coupled to a connection block 302. Data processing array 1002 may be implemented as a plurality of interconnected tiles. The term "tile," as used herein in connection with a data processing array, means a circuit block. The interconnected tiles of data processing array 1002 include compute tiles 1302, interface tiles 1304, and memory tiles 1306. The tiles illustrated in FIG. 13 may be arranged in an array or grid and are hardwired.

Each compute tile 1302 can include one or more cores 1308, a program memory (PM) 1310, a data memory (DM) 1312, a DMA circuit 1314, and a stream interconnect (SI) 1316. In one aspect, each core 1308 is capable of executing program code stored in program memory 1310. In one aspect, each core 1308 may be implemented as a scalar processor, as a vector processor, or as a scalar processor and a vector processor operating in coordination with one another.

In one or more examples, each core 1308 is capable of directly accessing the data memory 1312 within the same compute tile 1302 and the data memory 1312 of any other compute tile 1302 that is adjacent to the core 1308 of the compute tile 1302 in the north (up), south (down), west (left), and/or east (right) directions subject to isolation registers being appropriately programmed as discussed below. Core 1308 sees data memories 1312 within the same tile and in one or more other adjacent compute tiles in a same partition (e.g., a DFX region) as a unified region of memory (e.g., as a part of the local memory of the core 1308). This facilitates data sharing among different compute tiles 1302 in data processing array 1002. In other examples, core 1308 may be directly connected to data memories 1312 in other compute tiles 1302.

Cores 1308 may be directly connected with adjacent cores 1308 via core-to-core cascade connections (not shown), subject to isolation registers being appropriately programmed as discussed below. For example, those cores 1308 of a same partition may communicate with one another via core-to-core cascade connections. In one aspect, core-to-core cascade connections are unidirectional and direct connections between cores 1308. In another aspect, core-to-core cascade connections are bidirectional and direct connections between cores 1308. In general, core-to-core cascade connections allow the results stored in an accumulation register of a source core 1308 to be provided directly to an input of a target or load core 1308. This means that data provided over a cascade connection may be provided among cores directly with less latency since the data does not traverse the stream interconnect 1316 and is not written by a first core 1308 to data memory 1312 to be read by a different core 1308.

In an example implementation, compute tiles 1302 do not include cache memories. By omitting cache memories, data processing array 1002 is capable of achieving predictable, e.g., deterministic, performance. Further, significant processing overhead is avoided since maintaining coherency among cache memories located in different compute tiles 1302 is not required. In a further example, cores 1308 do not have input interrupts. Thus, cores 1308 are capable of operating uninterrupted. Omitting input interrupts to cores 1308 also allows data processing array 1002 to achieve predictable, e.g., deterministic, performance.

In the example of FIG. 13, each compute tile 1302 may be implemented substantially identically to include the same hardware components and/or circuitry. Further, data processing array 1002 may include an array of compute tiles formed of any of a variety of processing elements such as digital signal processing engines, cryptographic engines, Forward Error Correction (FEC) engines, or other specialized hardware for performing one or more specialized tasks.

In one or more other examples, compute tiles 1302 may not be substantially identical. In this regard, compute tiles 1302 may include a heterogeneous mix of compute tiles 1302 formed of two or more different types of processing elements. As an illustrative and nonlimiting example, different ones of compute tiles 1302 may include processing elements selected from two or more of the following groups: digital signal processing engines, cryptographic engines, Forward Error Correction (FEC) engines, or other specialized hardware.

In the example of FIG. 13, data processing array 1002 optionally includes one or more memory tiles 1306. Memory tiles 1306 include a memory 1318 (e.g., a RAM), a DMA circuit 1320, and a stream interconnect 1316. Each memory tile 1306 may read and/or write to the memory 1318 of an adjacent memory tile 1306 by way of the DMA circuit 1320 included in the memory tile 1306 subject to isolation registers being appropriately programmed as discussed below. Further, data can be moved to/from the data memory 1312 of any compute tile 1302 (e.g., by the corresponding DMA 1314) from/to the memory 1318 of any memory tile 1306 (e.g., by the corresponding DMA circuit 1320 or the DMA circuit 1320 of an adjacent memory tile 1306) subject to isolation registers being appropriately programmed as discussed below. In doing so, the data is routed through one or more of stream interconnects 1316. Memory tiles 1306 are characterized by the lack of computational components such as processors (e.g., cores 1308). In the example of FIG. 13, each memory tile 1306 may be implemented substantially identically to include the same hardware components and/or circuitry. In one or more other examples, memory tiles 1306 may not be substantially identical.

Interface tiles 1304 form an array interface 1322 for data processing array 1002. Array interface 1322 operates as an interface that connects tiles of data processing array 1002 to other resources of the particular IC in which data processing array 1002 is disposed. For example, array interface 1322 may communicatively link compute tiles 1302 and/or memory tiles 1306 with one or more other subsystems of the IC in which data processing array 1002 is disposed. Such other subsystems may include, but are not limited to, a network-on-chip, a processor system including one or more hardened processor and/or processor cores, programmable logic, memory, and/or other Application Specific IC (ASIC) blocks. In the example of FIG. 13, interface tile 1304-1 is coupled to connection block 302.

In the example of FIG. 13, array interface 1322 includes a plurality of interface tiles 1304 organized in a row. Interface tiles 1304 can include a stream interconnect 1316 and a DMA circuit 1324. Interface tiles 1304 are connected so that data may be propagated from one interface tile to another bi-directionally. Each interface tile 1304 is capable of operating as an interface for the column of tiles directly above and is capable of interfacing such tiles with components and/or subsystems of the IC in which data processing array 1002 is disposed.

In one example, array interface 1322 may communicatively link tiles of data processing array 1002 with a memory that is external to data processing array 1002. The memory may be read and/or written by host system. The memory may be implemented in the same IC as data processing array 1002. That is, the external memory may be an "on-chip" memory whether disposed on the same die as data processing array 1002 or on a different die than data processing array 1002 but within the same IC package. In another example, the external memory may be external to the IC in which data processing array 1002 is implemented. In that case, the external memory may be disposed on the same circuit board as the IC including data processing array 1002. For purposes of illustration, the external memory may be implemented as a Double Data Rate RAM (DDR) or a High-Bandwidth Memory (HBM).

Compute tiles 1302, memory tiles 1306, and interface tiles 1304 may be interconnected and communicate over a streaming network formed of streaming interconnects 1316. Communication among different tiles is also subject to isolation registers being appropriately programmed as discussed below. For example, only tiles disposed in a same partition may communicate by way of stream interconnects 1316.

In the example of FIG. 13, DFX region 104 is implemented to include a column of tiles of data processing array 1002. DFX region 104 may include one or more columns. The number of columns includes is for purposes of illustration. Further, additional connection blocks may be coupled to additional ones of interface tiles 1304. DFX region 104 may be reconfigured over time to implement different applications therein such that the directionality of signals conveyed using the bi-directional routing resource coupled to connection block 302 as the PPLOC node may change from one configuration to another. It should be appreciated to convey data streams of widths that match those of the data streams conveyed within data processing array 1002, more connection blocks and bi-directional routing resources may be required. To convey a 32-bit data stream, for example, 32 bi-directional routing resources may be used in parallel.

The number of tiles in columns and/or the number of tiles in rows of data processing array 1002 is provided for purposes of illustration. It should be appreciated that data processing array 1002 may include fewer tiles or more tiles. In the usual case, data processing array 1002 includes significantly more tiles, whether compute tiles 1302 and/or memory tiles 1306.

Figure 14:
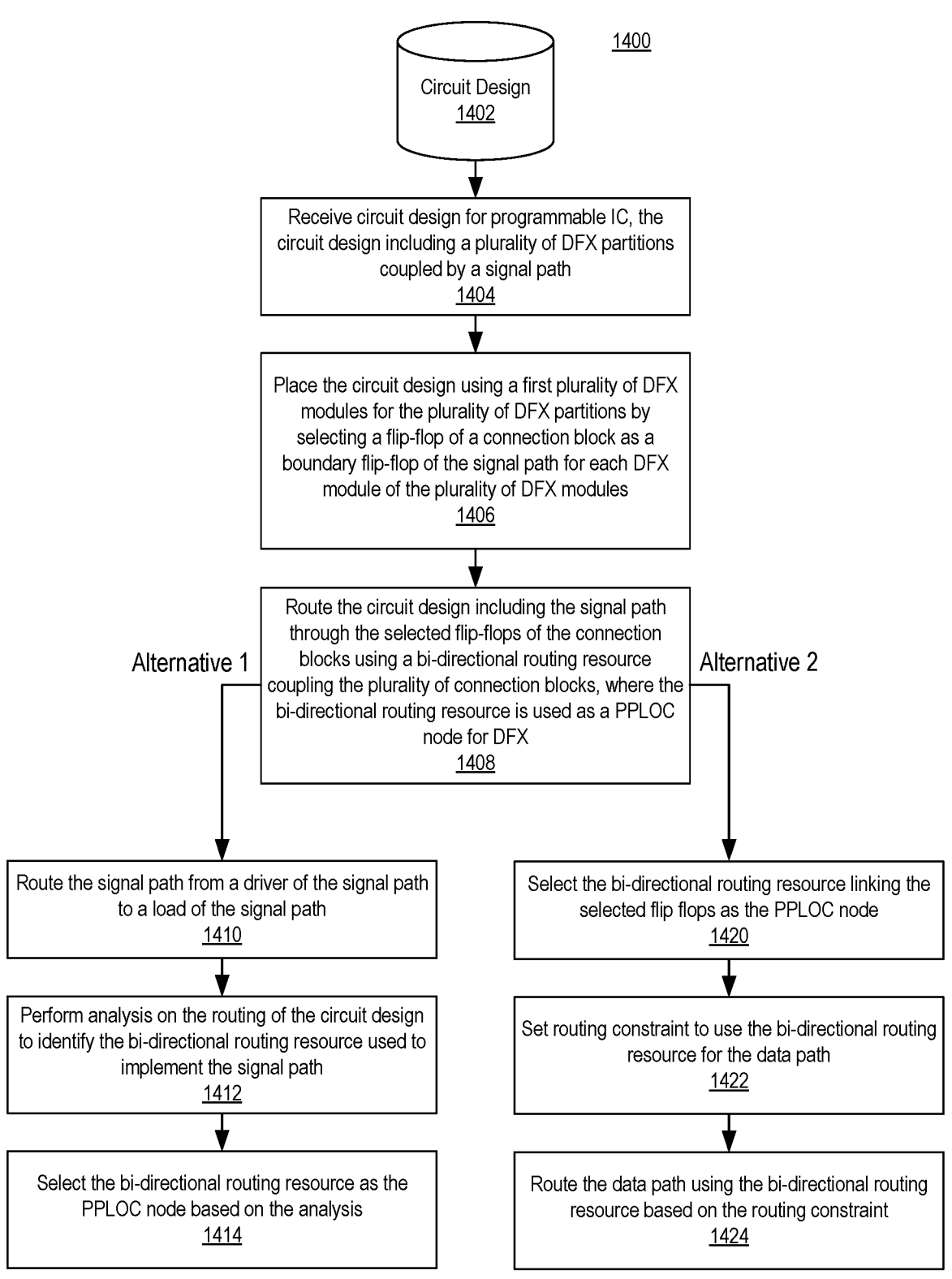
FIG. 14 illustrates an example method of implementing bi-directional boundary paths for DFX-enabled circuit designs.

FIG. 14 illustrates an example method 1400 of implementing bi-directional boundary paths for DFX-enabled circuit designs. Method 1400 may be performed by a data processing system (e.g., a computer) executing suitable operational software or program instructions to perform the various operations described within this disclosure. An example of a data processing system (e.g., system) capable of performing the operations described in connection with FIG. 14 is illustrated in the example of FIG. 10.

In block 1404, the system receives a circuit design 1402 for a programmable IC. Circuit design 1402 is a DFX-enabled circuit design. For example, circuit design 1402 includes a plurality of DFX partitions coupled by a signal path.

In block 1406, the system places circuit design 1402 using a first plurality of DFX modules for the plurality of DFX partitions, in part, by selecting a flip-flop 802 of a connection block as a boundary flip-flop of the signal path for each DFX module of the plurality of DFX modules. For example, the system may select a flip-flop 802 of connection block 302 as the boundary flip-flop of the DFX partition corresponding to DFX region 104 and select a flip-flop 802 of connection block 304 as the boundary flip-flop of the DFX partition corresponding to DFX region 106.

In one or more examples, depending on the architecture of the particular programmable IC used, flip-flops 802 may not be changed for subsequent reconfigurations. That is, the same flip-flops 802 selected in block 1406 may be used for each subsequent reconfiguration of the DFX regions. Such may be the case depending on the implementation of the connection block in the programmable IC. For example, in some cases, the architecture of the programmable IC may support a 1-to-1, e.g., fixed, mapping of connection blocks to bi-directional routing resources based on the implementation of switches 710, 712. In other cases, the switches may implement a 1-to-many mapping where different flip-flops 802 may be used from one configuration to another within the DFX regions.

In block 1408, the system routes circuit design 1402 including the signal path through the selected flip-flops 802 of the connection blocks using a bi-directional routing resource coupling the plurality of connection blocks. For example, the system routes circuit design 1402 including the signal path from a driver D of DFX module 110 to a load L of DFX module 112 for the signal path, where the signal path traverses through the selected flip-flop 802 of connection block 302 and the selected flip-flop 802 of connection block 304. The system selects a bi-directional routing resource 306 that couples connection block 302 with connection block 304. In one aspect, as part of block 1408, the system designates the selected bi-directional routing resource 306 as a PPLOC node for DFX.

In the example of FIG. 14, block 1408 may be implemented using alternative techniques illustrated as alternative 1 and alternative 2.

In the case of alternative 1, in block 1410, the system routes the signal path from a driver of the signal path to a load of the signal path. In block 1412, the system performs an analysis on the routing of circuit design 1402 to identify or detect the bi-directional routing resource used to implement the signal path between the DFX regions. In block 1414, the system selects the bi-directional routing resource identified or detected in block 1412 as the PPLOC node based on the analysis. Thus, in the case of alternative 1, the system designates the bi-directional routing resource as a PPLOC node subsequent to the routing. That is, the system performs a post-route process that analyzes the routing of a given boundary signal path (e.g., a signal path crossing from a DFX region to a non-DFX region), finds the bi-directional routing resource used for routing the signal path, and assigns a PPLOC to the bi-directional routing resource.

In the case of alternative 2, in block 1420, the system selects the bi-directional routing resource linking the selected flip-flops 802 as the PPLOC node. In block 1422, the system sets a routing constraint for circuit design 1402 to use (e.g., requiring the use) of the bi-directional routing resource for the data path to link the selected flip-flops 802. In block 1424, the system routes the data path using the bi-directional routing resource based on the routing constraint (e.g., observing or complying with the routing constraint set in block 1422). In the case of alternative 2, a bi-directional routing resource is identified as the PPLOC node prior to the routing and the routing is forced to use that particular resource for the signal path.

It should be appreciated that for a first set of DFX modules (e.g., DFX modules 110, 112), the system routes the signal path using the bi-directional routing resource in a first direction, e.g., from driver to load. The system may update circuit design 1402 with a second plurality of DFX modules (e.g., DFX modules 402, 404) for the plurality of DFX partitions and perform placement and routing for the second plurality of DFX modules using the PPLOC node from the first configuration. Thus, the signal path coupling the second plurality of DFX modules uses the (same) bi-directional routing resource used for the first configuration including the first plurality of DFX modules. It should be appreciated that the signal path coupling the second plurality of DFX modules using the bi-directional routing resource is routed in a second direction, wherein the second direction is different than the first direction.

As discussed, in one aspect, the plurality of DFX regions are located in different dies of the programmable IC. In another aspect, the plurality of DFX regions are located in a same die of the programmable IC.

Figure 15:
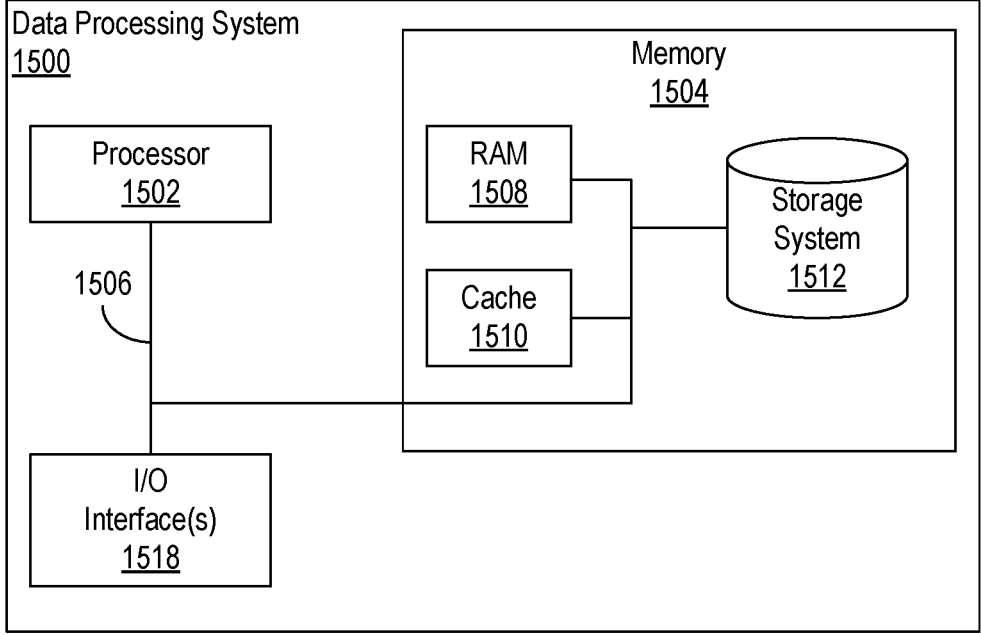
FIG. 15 illustrates an example implementation of a data processing system for use with the inventive arrangements described within this disclosure.

FIG. 15 illustrates an example implementation of a data processing system 1500. As defined herein, the term "data processing system" means one or more hardware systems configured to process data, each hardware system including at least one processor and memory, wherein the processor is programmed with computer-readable instructions that, upon execution, initiate operations. Data processing system 1500 can include a processor 1502, a memory 1504, and a bus 1506 that couples various system components including memory 1504 to processor 1502.

Processor 1502 may be implemented as one or more processors. In an example, processor 1502 is implemented as a central processing unit (CPU). Processor 1502 may be implemented as one or more circuits, e.g., hardware, capable of carrying out instructions contained in program code. The circuit may be an integrated circuit or embedded in an integrated circuit. Processor 1502 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 1506 represents one or more of any of a variety of communication bus structures. By way of example, and not limitation, bus 1506 may be implemented as a Peripheral Component Interconnect Express (PCIe) bus. Data processing system 1500 typically includes a variety of computer system readable media. Such media may include computer-readable volatile and non-volatile media and computer-readable removable and non-removable media.

Memory 1504 can include computer-readable media in the form of volatile memory, such as random-access memory (RAM) 1508 and/or cache memory 1510. Data processing system 1500 also can include other removable/non-removable, volatile/non-volatile computer storage media. By way of example, storage system 1512 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1506 by one or more data media interfaces. Memory 1504 is an example of at least one computer program product.

Memory 1504 is capable of storing computer-readable program instructions that are executable by processor 1502. For example, the computer-readable program instructions can include an operating system, one or more application programs, other program code, and program data. Processor 1502, in executing the computer-readable program instructions, is capable of performing the various operations described herein. For example, the computer-readable program instructions, when executed, may implement one or more circuit design implementation tools capable of performing the operations described within this disclosure. In this regard, the data processing system 1500 may perform operations including, but not limited to, synthesis, placement, and/or routing (e.g., a design flow) on a circuit design or portion thereof so that a circuit design may be physically realized in an IC.

It should be appreciated that data items used, generated, and/or operated upon by data processing system 1500 are functional data structures that impart functionality when employed by data processing system 1500. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 1500 may include one or more Input/Output (I/O) interfaces 1518 communicatively linked to bus 1506. I/O interface(s) 1518 allow data processing system 1500 to communicate with one or more external devices and/or communicate over one or more networks such as a local area network (LAN), a wide area network (WAN), and/or a public network (e.g., the Internet). Examples of I/O interfaces 1518 may include, but are not limited to, network cards, modems, network adapters, hardware controllers, etc. Examples of external devices also may include devices that allow a user to interact with data processing system 1500 (e.g., a display, a keyboard, and/or a pointing device) and/or other devices such as accelerator card.

Data processing system 1500 is only one example implementation. Data processing system 1500 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules/code may be located in both local and remote computer system storage media including memory storage devices.

The example of FIG. 15 is not intended to suggest any limitation as to the scope of use or functionality of example implementations described herein. Data processing system 1500 is an example of computer hardware that is capable of performing the various operations described within this disclosure. In this regard, data processing system 1500 may include fewer components than shown or additional components not illustrated in FIG. 15 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon,"

means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "individual" and "user" each refer to a human being.

As defined herein, the term "hardware processor" means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms "one embodiment," "an embodiment," "in one or more embodiments," "in particular embodiments," or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc., may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
receiving a circuit design for a programmable IC, wherein the circuit design includes a plurality of dynamic function exchange (DFX) partitions coupled by a signal path;
placing the circuit design using a first plurality of DFX modules for the plurality of DFX partitions, in part, by selecting a selected flip-flop of a connection block as a boundary flip-flop of the signal path for each DFX module of the plurality of DFX modules; and
routing the circuit design including the signal path through the selected flip-flops of the connection blocks using a bi-directional routing resource coupling the connection blocks, wherein the bi-directional routing resource is used as a partition pin placement constraint (PPLOC) node for DFX.

2. The method of claim 1, wherein the routing routes the signal path from a driver of the signal path to a load of the signal path, the method further comprising:
performing an analysis on the routing of the circuit design to identify the bi-directional routing resource used to implement the signal path; and
based on the analysis, selecting the bi-directional routing resource as the PPLOC node.

3. The method of claim 1, wherein the routing comprises:
selecting the bi-directional routing resource linking the selected flip-flops as the PPLOC node, setting a routing constraint to use the bi-directional routing resource for the signal path, and routing the signal path using the bi-directional routing resource based on the routing constraint.

4. The method of claim 1, wherein the routing comprises:
routing the signal path using the bi-directional routing resource in a first direction.

5. The method of claim 4, further comprising:
updating the circuit design with a second plurality of DFX modules for the plurality of DFX partitions and performing placement and routing for the second plurality of DFX modules using the PPLOC node.

6. The method of claim 5, wherein the signal path coupling the second plurality of DFX modules uses the bi-directional routing resource.

7. The method of claim 6, wherein the signal path coupling the second plurality of DFX modules using the bi-directional routing resource is routed in a second direction, wherein the second direction is different than the first direction.

8. The method of claim 1, wherein the plurality of DFX partitions correspond to DFX regions located in different dies or in different chiplets of the programmable IC.

9. The method of claim 1, wherein the plurality of DFX partitions correspond to DFX regions located in a same die of the programmable IC.

10. A system, comprising:
one or more hardware processors configured to initiate operations including:
receiving a circuit design for a programmable IC, wherein the circuit design includes a plurality of dynamic function exchange (DFX) partitions coupled by a signal path;
placing the circuit design using a first plurality of DFX modules for the plurality of DFX partitions, in part, by selecting a selected flip-flop of a connection block as a boundary flip-flop of the signal path for each DFX module of the plurality of DFX modules; and
routing the circuit design including the signal path through the selected flip-flops of the connection blocks using a bi-directional routing resource coupling the connection blocks, wherein the bi-directional routing resource is used as a partition pin placement constraint (PPLOC) node for DFX.

11. The system of claim 10, wherein the routing routes the signal path from a driver of the signal path to a load of the signal path, wherein the one or more hardware processors are programmed to initiate operations further comprising:
performing an analysis on the routing of the circuit design to identify the bi-directional routing resource used to implement the signal path; and
based on the analysis, selecting the bi-directional routing resource as the PPLOC node.

12. The system of claim 10, wherein the routing comprises:
selecting the bi-directional routing resource linking the selected flip-flops as the PPLOC node, setting a routing constraint to use the bi-directional routing resource for the signal path, and routing the signal path using the bi-directional routing resource based on the routing constraint.

13. The system of claim 10, wherein the routing comprises:
routing the signal path using the bi-directional routing resource in a first direction.

14. The system of claim 13, wherein the one or more hardware processors are programmed to initiate operations further comprising:
updating the circuit design with a second plurality of DFX modules for the plurality of DFX partitions and performing placement and routing for the second plurality of DFX modules using the PPLOC node.

15. The system of claim 14, wherein the signal path coupling the second plurality of DFX modules uses the bi-directional routing resource.

16. The system of claim 15, wherein the signal path coupling the second plurality of DFX modules using the bi-directional routing resource is routed in a second direction, wherein the second direction is different than the first direction.

17. The system of claim 10, wherein the plurality of DFX partitions correspond to DFX regions located in different dies or in different chiplets of the programmable IC.

18. The system of claim 10, wherein the plurality of DFX partitions correspond to DFX regions located in a same die of the programmable IC.

19. A system, comprising:

a first dynamic function exchange (DFX) region;

a second DFX region; and a signal path using a bi-directional routing resource communicatively linking first circuitry implemented in the first and second DFX regions in a first direction;

wherein each of the first and second DFX regions includes a connection block coupled to the signal path, and wherein each connection block includes a selected flip-flop as a boundary flip-flop of the signal path;

wherein the first and second DFX regions are reconfigurable to implement second circuitry that communicates over the signal path in a second and different direction; and wherein the signal path extends through the selected flip-flop of each connection block using a bi-directional routing resource, and wherein the bi-directional routing resource is used as a partition pin placement constraint (PPLOC) node for DFX.

20. The system of claim 19, wherein the first and second DFX regions are disposed in different dies or in different chiplets.

\* \* \* \* \*